United States Patent
Xu et al.

(10) Patent No.: US 11,687,248 B2
(45) Date of Patent: Jun. 27, 2023

(54) LIFE TIME EXTENSION OF MEMORY DEVICE BASED ON RATING OF INDIVIDUAL MEMORY UNITS

(71) Applicant: Micron Technology, Inc., Boise, ID (US)

(72) Inventors: Zhongguang Xu, San Jose, CA (US); Zhenlei Shen, Milpitas, CA (US); Tingjun Xie, Milpitas, CA (US); Seungjune Jeon, Santa Clara, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/302,851

(22) Filed: May 13, 2021

(65) Prior Publication Data
US 2022/0365684 A1 Nov. 17, 2022

(51) Int. Cl.
*G06F 11/07* (2006.01)
*G06F 3/06* (2006.01)
*G06F 11/30* (2006.01)

(52) U.S. Cl.
CPC .......... *G06F 3/0616* (2013.01); *G06F 3/0619* (2013.01); *G06F 3/0659* (2013.01); *G06F 3/0679* (2013.01); *G06F 11/076* (2013.01); *G06F 11/3034* (2013.01)

(58) Field of Classification Search
CPC .... G06F 3/0616; G06F 3/0619; G06F 3/0659; G06F 3/0679; G06F 11/076; G06F 11/3034
See application file for complete search history.

(56) References Cited

U.S. PATENT DOCUMENTS

| | | | |
|---|---|---|---|
| 2012/0239991 A1* | 9/2012 | Melik-Martirosian | G06F 11/3055 711/E12.001 |
| 2016/0170871 A1* | 6/2016 | Hyun | G06F 3/06 711/103 |
| 2017/0068467 A1* | 3/2017 | Roth | G11C 16/3495 |
| 2017/0131947 A1* | 5/2017 | Hoang | G06F 11/3034 |
| 2018/0267705 A1* | 9/2018 | Liu | G06F 12/0246 |
| 2022/0147252 A1* | 5/2022 | Liu | G06F 3/0679 |
| 2022/0188151 A1* | 6/2022 | Muthiah | G06F 12/0246 |

* cited by examiner

*Primary Examiner* — Matthew M Kim
*Assistant Examiner* — Kyle Emanuele
(74) *Attorney, Agent, or Firm* — Lowenstein Sandler LLP (57) ABSTRACT

Respective life expectancies of a first data unit and a second data unit of the memory device is obtained. A first initial age value corresponding to the first data unit and a second initial age value corresponding to the second data unit are determined. A lower one of the first initial age value and the second initial age value is identified. A first media management operation on a corresponding one of the first data unit or the second data unit associated with the lower one of the first initial age value and the second initial age value is performed. A second media management operation on the first data unit and the second data unit is performed.

15 Claims, 6 Drawing Sheets

LIFE TIME EXTENSION OF MEMORY DEVICE BASED ON RATING OF INDIVIDUAL MEMORY UNITS

TECHNICAL FIELD

Embodiments of the disclosure relate generally to memory sub-systems, and more specifically, relate to life time extension of memory devices based on rating of individual memory units.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to life time extension of memory devices based on rating of individual memory units. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Another example is a three-dimensional cross-point ("3D cross-point") memory device that includes an array of non-volatile memory cells. A 3D cross-point memory device can perform bit storage based on a change of bulk resistance, in conjunction with a stackable cross-gridded data access array. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or three-dimensional grid. Memory cells are etched onto a silicon wafer in an array of columns (also hereinafter referred to as bitlines (BL)) and rows (also hereinafter referred to as wordlines (WL)). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. A 3D cross-point based memory device may be called a "drive", which has multiple dies layered in multiple "decks." So a "segment" of a 3D cross-point memory device can mean one or more decks, one or more dies, or one or more cells that are not necessarily physically contiguous but have common characteristics, e.g., have same electrical distance (ED) to wordlines (WL) and/or bitlines (BL).

In conventional memory sub-systems, the variation in temperature and/or processing drift can negatively impact the reliability of memory devices. For example, excessive temperature used in the heating process during assembly can, over a period of time, cause crystallization of areas of the memory device (e.g., amorphous phase change memory in reset memory cells). This crystallization can decrease resistivity of the memory cells, which, in turn, decreases the threshold voltage of the memory cells. This lowering of threshold voltage can negatively impact reliability as the high voltage levels can cause voltage level instability, resulting in a higher error rate for the memory device during the operating life time of the memory sub-system.

These properties of the memory sub-system can provide challenges in the operation of the memory sub-system and ultimately limit endurance. For example, some memory devices can be written, read, or erased a finite number of times before the memory devices begin to physically degrade or wear and eventually fail.

The memory sub-system controller can perform media management operations to mitigate the amount of physical wear on the memory devices and lengthen the overall life time of the memory sub-system. For example, the memory sub-system controller can perform a media management operation (e.g., a wear leveling operation) to distribute the physical wear across data units of a memory device. Wear leveling operations are typically performed in the background on conventional memory sub-systems every constant cycle count of the memory sub-system. A data unit refers to a particular amount of memory, such as a page or a block, of a memory device. To perform a media management operation, the memory sub-system controller can identify a data unit at a memory device that is subject to a significant amount of physical wear and can move data stored at the data unit to another data unit subject to a smaller amount of physical wear. In some instances, a data unit can be subject to a significant amount of physical wear if a large number of memory access operations, such as write operations (i.e., program operations) or read operations, are performed at the data unit.

Conventional memory sub-systems typically perform media management operations uniformly on a memory device under the assumption that all data units of the memory device have uniform properties (e.g., wear-out characteristics and degradation ratio). However, data units of the conventional memory sub-system are rarely uniform and typically exhibit varying wear-out characteristics which results in some data units being worse than others. As previously described, the data units may exhibit varying wear-out characteristics due to unique properties of the data units in the memory sub-system which are based on physical location and process variation, for example, the decks of the memory sub-system, ED to WL and/or BL segments, and/or other process properties (e.g., crystallization on the memory sub-system). As such, media management operations are performed on the memory device until one or more of the data units are no longer capable of media management. Once one or more data units of the memory device are no longer capable of media management the entire drive is retired to prevent failure of those data units. As such, conventional memory sub-system typically define the life time age of the memory device by its worst data unit and waste usage of the better data units.

Aspects of the present disclosure address the above and other deficiencies by having a memory sub-system that optimizes the media management operation (e.g., wear leveling operation) to extend the life time of the memory sub-system based on the best data unit of the memory sub-system. Since the properties of the data units are not uniform, the memory sub-system performs a seasoning operation on each of the data units to obtain wear out-characteristics of each respective data unit. By performing seasoning operations on the memory sub-system, the memory sub-system can determine a life expectancy (e.g., number of cycle counts that can be performed on the data unit before failure) of the data units. Once the life expectancy of the data units are determined, the memory sub-system determines an initial age value of the data units to optimize the wear level operation. In one embodiment, the initial age value is the difference between the life expectancy of the best data unit in the memory sub-system and the life expectancy of a specific data unit. The wear leveling operation is optimized by including each data unit into the wear leveling operation once the initial age value represented in cycle counts matches or exceeds the cycle count of the memory sub-system.

Advantages of the present disclosure include, but are not limited to, increasing the life time of the memory sub-system by extending the life time of the memory sub-system to the healthiest data unit and providing smart wear leveling operation to the memory sub-system to avoid excessive wear leveling of weaker data units.

Figure 1:
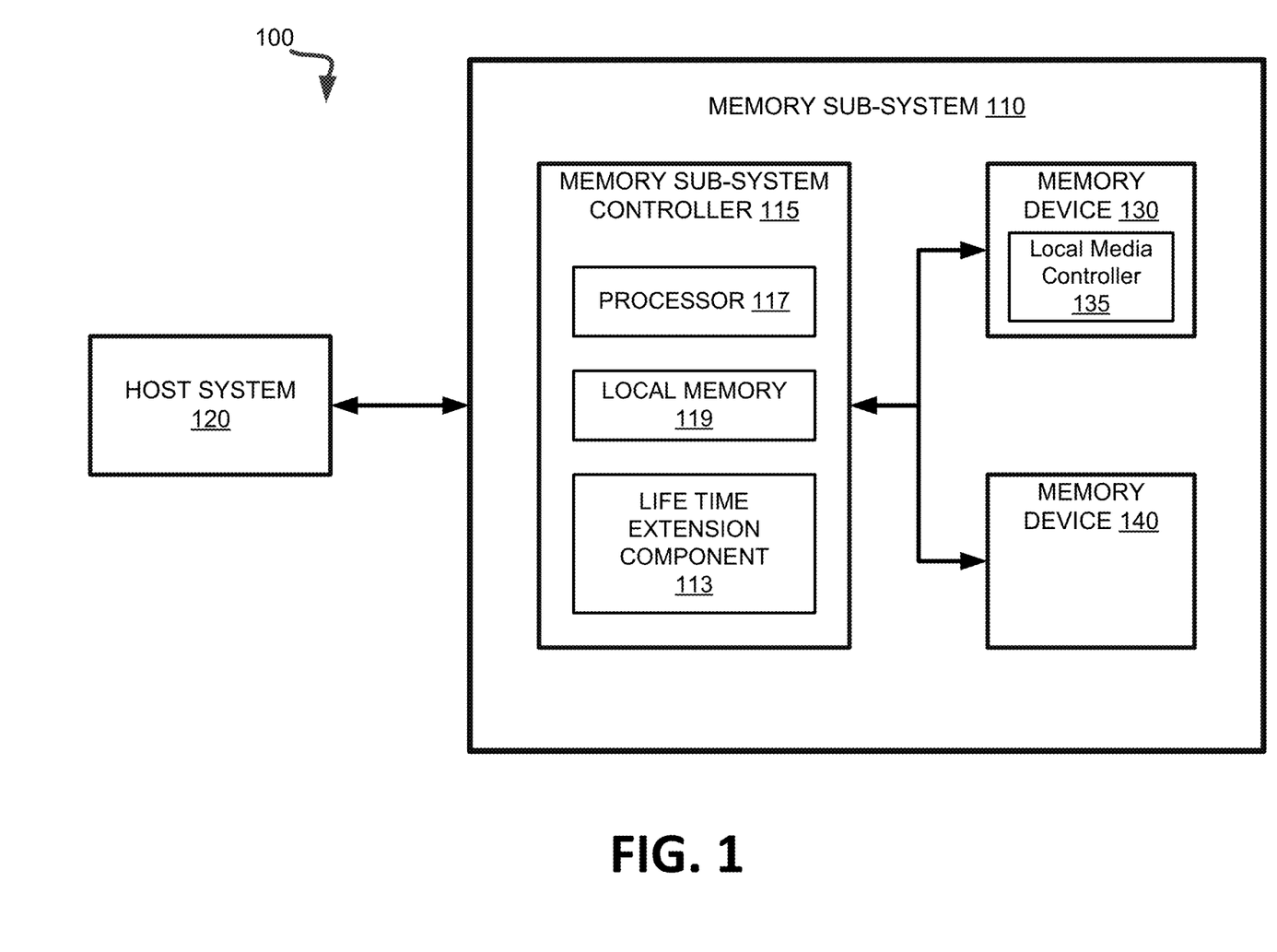
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. Some types of memory, such as 3D cross-point, can group pages across dice and channels to form management units (MUs).

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a life time extension component 113 that can extend the life time of memory devices 130, 140 by determining a point at which each data unit is included into the wear leveling operation. In some embodiments, the memory sub-system controller 115 includes at least a portion of the life time extension component 113. In some embodiments, the life time extension component 113 is part of the host system 110, an application, or an operating system. In other embodiments, local media controller 135 includes at least a portion of life time extension component 113 and is configured to perform the functionality described herein.

The life time extension component 113 can facilitate performing life time extension operations on memory device 130, 140 by determining the life expectancies of data units (e.g., a block, a page, etc.). Life time extension component 113 can obtain a life expectancy of the data units and, based on the life expectancy of the data units, determine an initial age value corresponding to each of the data units. Life time extension component 113 utilizes the initial age value of the data units to identify the healthiest data unit of the data units. The healthiest data unit refers to the data unit with the longest life expectancy which is determined by the data unit that can sustain the most number of cycle counts performed on the data unit before failure. In response to identifying the healthiest data unit of the data units, the life time extension component 113 performs a media management operation on the healthiest data unit and thereafter includes additional data units in subsequent media management operations incrementally based on their respective initial age values. Further details with regards to the operations of the life time extension component 113 are described below.

Figure 2:
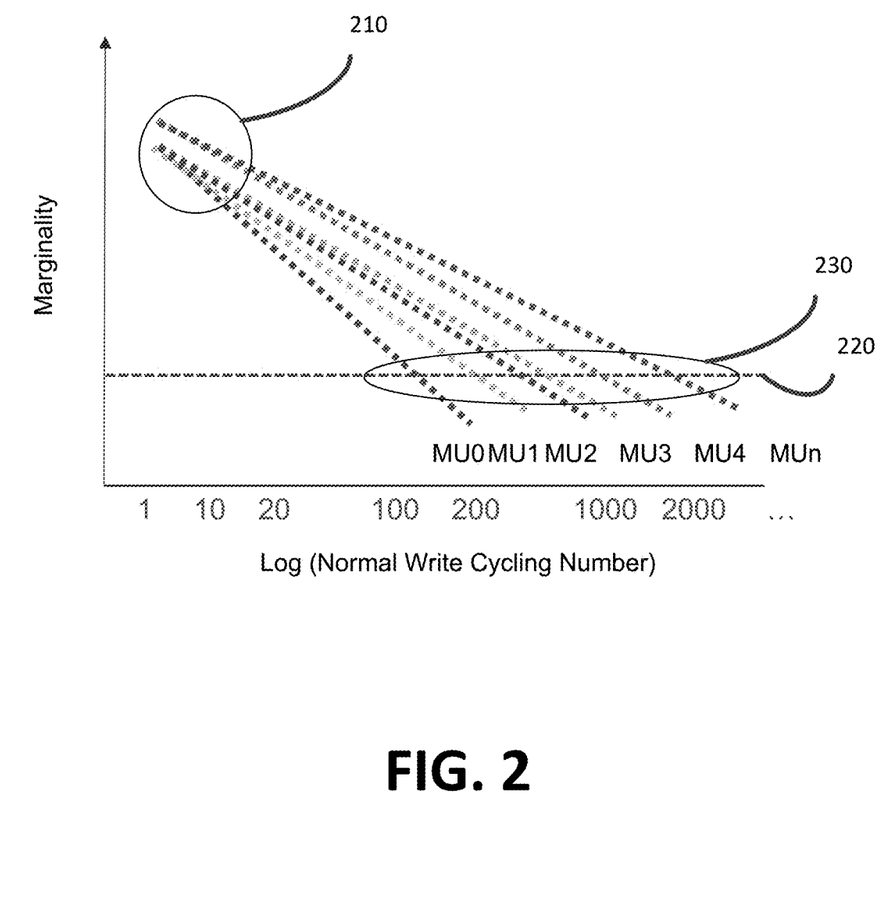
FIG. 2 is a chart of the results of a seasoning operation performed on the memory sub-system in accordance with some embodiments of the present disclosure.

FIG. 2 illustrates the results of a seasoning operation performed on the data units, in accordance with some embodiments of the present disclosure. A seasoning operation is performed on memory device 130, 140 to obtain a life expectancy for each of the data units. Seasoning includes performing repetitive cycles of specialized read or write operations on the memory devices 130, 140 to stabilize the voltage levels of the data units. During these seasoning cycles, voltage pulses are applied to the memory device 130, 140 to stabilize the voltage levels of the data units to predetermined set and reset voltage states. For example, the voltage pulses are applied to obtain the variation in degradation of set and reset marginality for a number of data units with an increased number of write cycles under normal operating conditions. Normal operating conditions can include using standard voltage pulses for a write cycle and/or a read cycle at room temperature. Marginality of the data units (e.g., MU1, MU2, MU3, MU4, or MUn) are plotted against a logarithmic number of write cycles under a normal operating condition. In particular, each line of in the cluster 210 indicates the marginality of a particular data unit plotted against logarithmic number of write cycles. The life expectancy of each data unit is the logarithmic number of write cycles value based on section 230 at which the marginality of the data unit degrades below a threshold margin 220. Depending on the embodiment, the life expectancy of each data unit represented as the logarithmic number of write cycles can be stored at the SMU-level or the die-level.

Figure 3:
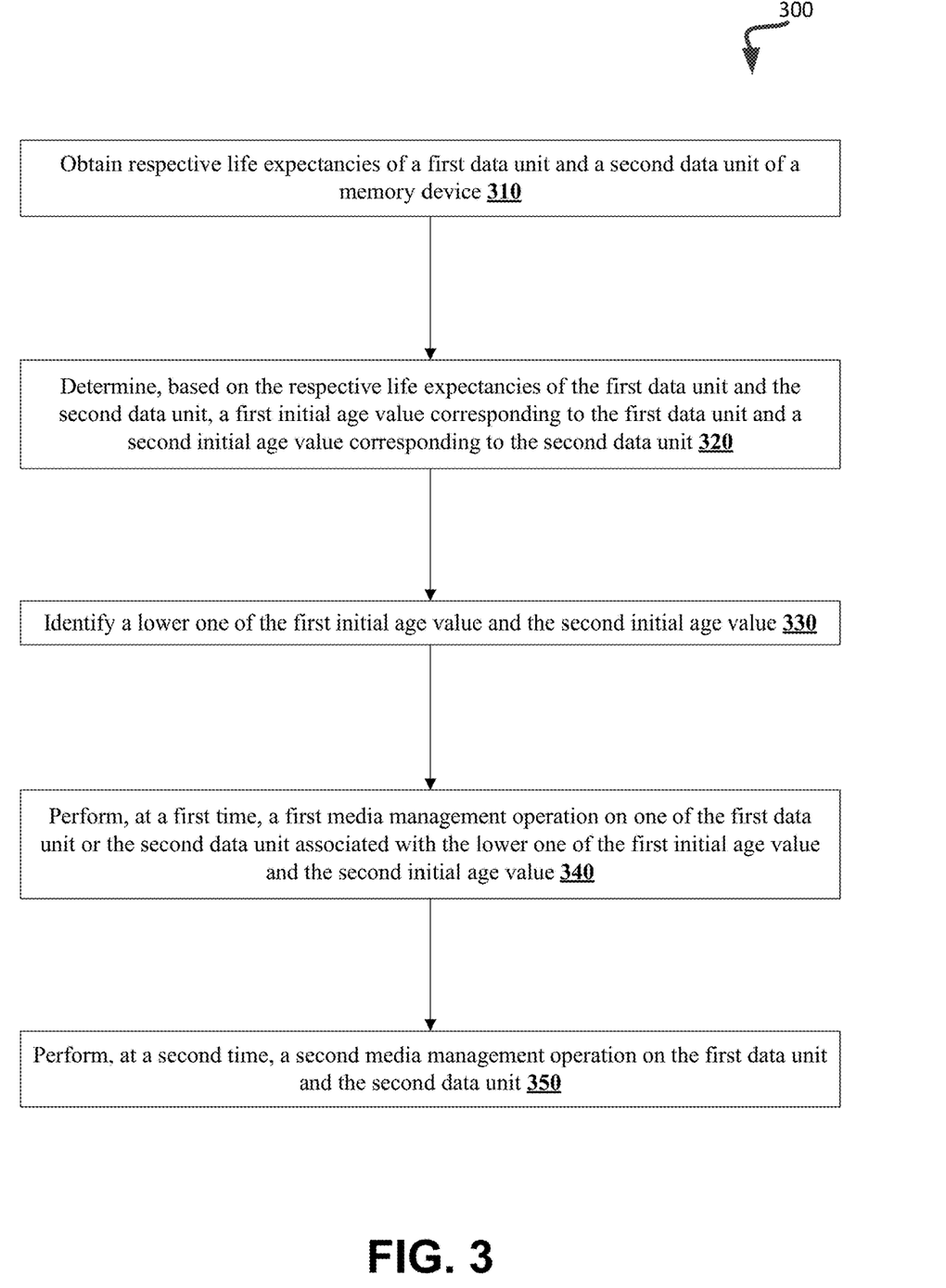
FIG. 3 is a flow diagram of an example method for memory device extension in accordance with some embodiments of the present disclosure.

FIG. 3 is a flow diagram of an example method 300 to determine an initial age value based on the life expectancy of the data units and utilize the initial age value to optimize wear leveling operation on the memory device, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the life time extension component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic obtains the life expectancies from the data units (e.g., first data unit and a second data unit) of the memory device. As described previously, the life expectancy of the first data unit (e.g., 80K) and the life expectancy of the second data unit (e.g., 100K) can be obtained via performing a seasoning operation on the memory device. The life expectancy determined by the seasoning operation represents the number of cycle counts performed on the data unit before failure (e.g., the logarithmic number of write cycles after which the marginality of the data unit degrades below a threshold margin after a specified number of write cycle).

At operation 320, the processing logic determines, based on the respective life expectancies of the first data unit and the second data unit, an initial age value (e.g., first initial age value) corresponding to the first data unit and an initial age value (e.g., second initial age value) corresponding to the second data unit. In determining the first initial age value and the second initial age value, the processing logic determines the longest life expectancy between the first data unit and the second data unit (e.g., 100K). The longest life expectancy between data units is associated with the data unit that has the most number of cycle counts that can be performed on the data unit before failure (e.g., the data unit with the largest logarithmic number of write cycles after which the marginality of the data unit degrades below a threshold margin after a specified number of write cycle derived from the seasoning operation).

In response to determining which of the first data unit or the second data unit has the longest life expectancy, the processing logic calculates the first initial age value and second initial age value based on a difference between the longest life expectancy (e.g., a target life expectancy of the data units) and the life expectancy of the respective data unit. For example, the first initial age value is the difference between the target life expectancy (e.g., 100K) and the life expectancy of the first data unit (e.g., 80K) and the second initial age value is the difference between the target life expectancy (e.g., 100K) and the life expectancy of the second data unit (e.g., 100K). The first initial age value (e.g., 20K) and the second initial age value (e.g., 0K) represent a cycle count at which point media management operations (e.g., wear leveling operations) can be performed on the data unit associated with the initial age value. For example, media management operations can be performed on the first data unit at a cycle count or after a cycle count of 20K since the first initial age value is 20K and media management operation can be performed on the second data unit at a cycle count or after a cycle count of 0K since the second initial age value is 0K.

At operation 330, the processing logic identifies a lower of the first initial age value and the second initial age value.

As described previously, the first initial age value (e.g., 20K) and the second initial age value (e.g., 0K) represents a cycle count at which point media management operations can be performed on the corresponding data units. For example, to identify the lower of the first initial age value and the second initial age value, the processing logic compares the first initial age value (e.g., 20K) and the second initial age value (e.g., 0K). In this instance, for example, the second initial age value corresponding to the second data unit is the lowest of the first initial age value and the second initial age value.

At operation 340, the processing logic performs, at a first time, a first media management operation (e.g. a first wear leveling operation) on one of the first data unit or the second data unit associated with the lower one of the first initial age value and the second initial age value. In this instance, for example, the second data unit associated with the second initial age value was previously determined, in operation 330, to be the lower of the first and second initial age value. As described previously, media management operations are performed every constant cycle count on the memory device, as such, the first time is the cycle count at which point the media management operation is performed on the one of the first data unit or the second data unit of the memory device based on the cycle count matching the initial age value of the data unit. For example, a first media management operation is performed on the second data unit based on the second initial age value (e.g., 0K) matching the media management operation performed on the memory device at 0K cycle count.

At operation 350, the processing logic performs, at a second time, a second media management operation (e.g. a second wear leveling operation) on the first data unit and the second data. In this instances, for example, since there are two data units (e.g., the first data unit and the second data unit), the data unit not included in the first wear leveling operation is subsequently added with the data unit of the first wear leveling operation in the second wear leveling operation at the second time. The second time is the cycle count at which point the media management operation (e.g., wear level operation) is performed on the memory device based on the constant cycle count that matches the initial age value of the other data unit not included in the first wear level operation. For example, the second wear leveling operation is performed on the first data unit and the second data unit based on the first initial age value (e.g., 20K) of the first data unit matching the media management operation performed on the memory device at 20K cycle count.

Figure 4:
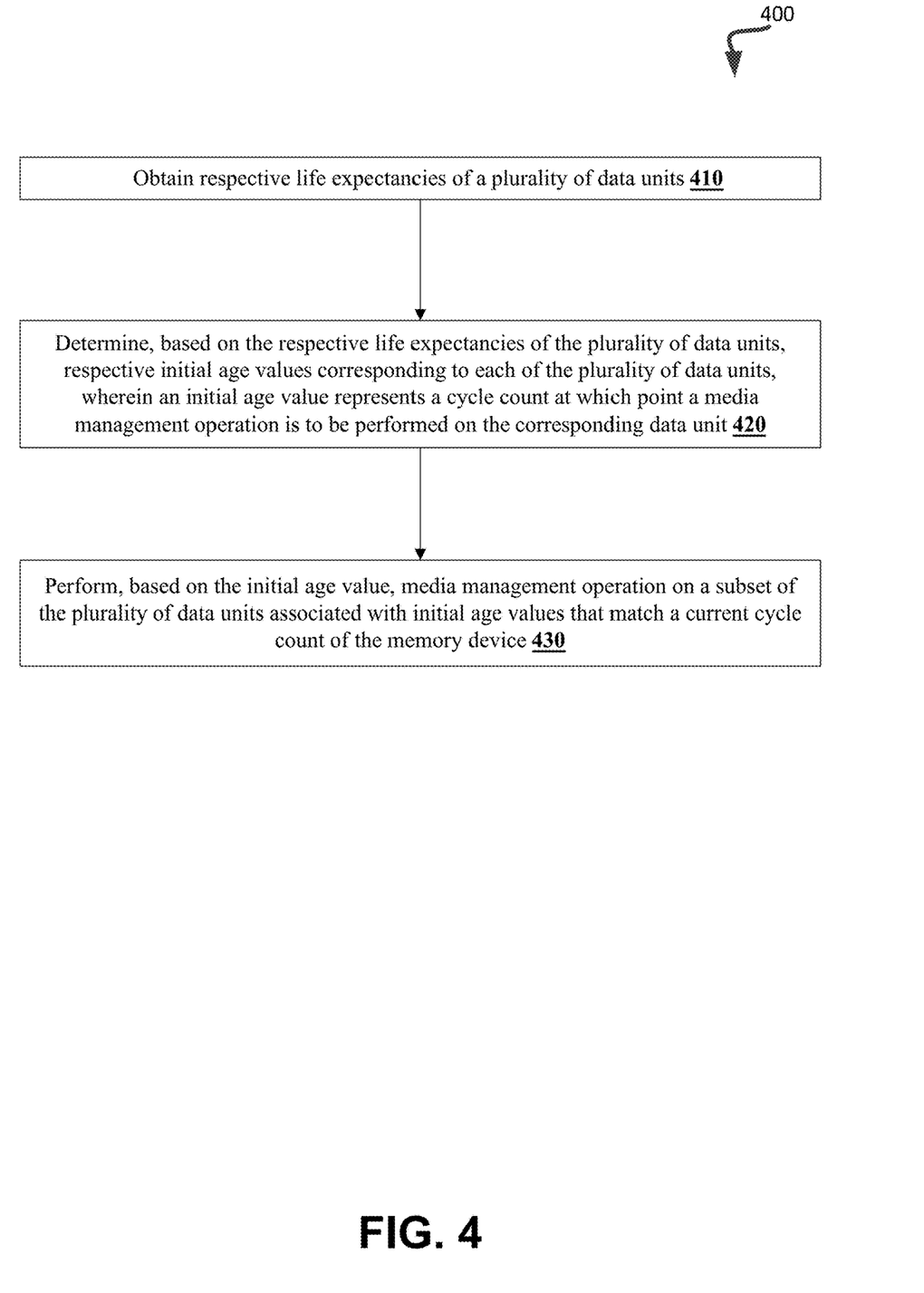
FIG. 4 is a flow diagram of another example method for memory device extension in accordance with some embodiments of the present disclosure.

FIG. 4 is a flow diagram of an example method 400 to determine an initial age value based on the life expectancy of the data units and utilize the initial age value of the data units to optimize wear leveling operation on the memory device, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the life time extension component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic obtains respective life expectancy for each of a plurality of data units (e.g., MU0, MU1, MU2, MU3, MU4, and MUn of FIG. 2) of the memory device. As described previously, the life expectancy of the plurality of data units can be obtained via seasoning operation performed on the memory device. The life expectancy determined by the seasoning operation represents the number of cycle counts performed on the data unit before failure (e.g., the logarithmic number of write cycles in which the marginality of the data unit degrades below a threshold margin after a specified number of write cycle.)

At operation 420, the processing logic calculates, based on the respective life expectancies of the plurality of data units, an initial age value corresponding to each of the plurality of data units, wherein the initial age value represents a cycle count at which point media management operation can be performed on the respective data unit. In calculating the initial age value corresponding to each of the plurality of data units, the processing logic determines the longest life expectancy between the data units of the plurality of data units (e.g., target life expectancy of the plurality of data units). To determine the target life expectancy of the plurality of data units, the processing logic compares the life expectancy of the plurality of data units with one another to determine the longest life expectancy. The processing logic, in response to determining the target life expectancy, calculates the initial age value corresponding to each of the plurality of data units based on the differences between the target life expectancy (e.g., longest life expectancy) and the respective life expectancy of each data unit of the plurality of data units.

At operation 430, the processing logic performs, based on the initial age value, media management operation on the data units associated with the initial age values that satisfies a media management operation threshold criterion. As described previously, media management operations (e.g., wear leveling operation) are performed every constant cycle count on the memory device. Every constant cycle count that wear leveling operation is performed on the memory device, the processing logic determines which initial age value of the data units of the plurality of data units satisfies the media management operation threshold criterion. The media management operation threshold criterion is satisfied if the initial age value of the data unit of the plurality of data unit meets or exceed the current cycle count. If the media management operation threshold criterion is not satisfied, the processing logic does not include the data unit of the plurality of data units into the wear leveling operations.

Figure 5:
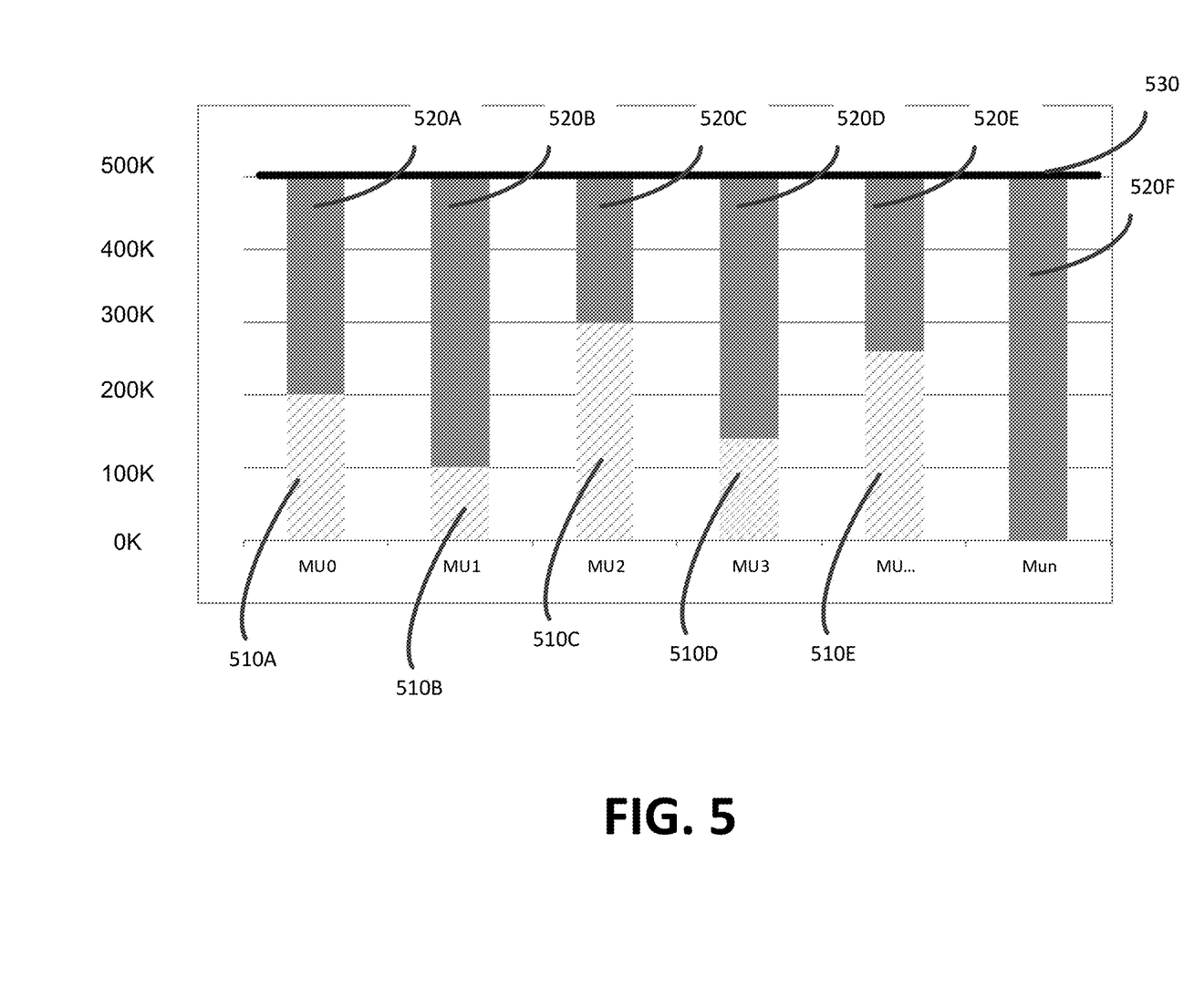
FIG. 5 is a chart of the life expectancy of the memory sub-system with an initial age value in accordance with some embodiments of the present disclosure.

FIG. 5 illustrates a chart of life expectancies of the data units and their respective initial age value, in accordance with some embodiments of the present disclosure. The plurality of data units (e.g., MU0, MU1, MU2, MU3, MU4, and MUn) are plotted against a cycle count of the memory device. Each data unit of the plurality of the data units includes an initial age value 510a, 510b, 510c, 510d, 510e, 510f and a life expectancy 520a, 520b, 520c, 520d, 520e, 510f. As described previously, prior to the life time extension component 113, the memory drive is retired based on the shortest life expectancy of the data unit of the plurality of data units. Based on the implementation of the life time extension component 113, a memory device cutoff 530 is set at the longest life expectancy of the data unit of the plurality of data units (e.g., MUn). In extending the life of the each data unit of the plurality of data units to match the life expectancy of MUn, the life time extension component 113 performs wear leveling operation each constant cycle (e.g., every 100K) on the data units of the plurality of data units based on whether the initial age value of the data unit of the plurality of data units meets or exceed the cycle count. In FIG. 5, for example, wear leveling operation performed at cycle count 0K includes MUn based on the initial age value 510$f$ (e.g., 0K) of MUn matching or exceeding the cycle count 0K. Wear leveling operation performed at cycle count 100K includes data units of the previous wear leveling operation and MU1 based on the initial age value 510$f$ (e.g., 100K) of MU1 matching or exceeding the cycle count 100K. Wear leveling operation performed at cycle count 200K includes data units of the previous wear leveling operation, MU3 based on the initial age value 510$f$ (e.g., 150K) of MU3, and MU0 based on the initial age value 510$f$ (e.g., 200K) of MU0 matching or exceeding the cycle count 200K. Wear leveling operation performed at cycle count 300K and 400K includes data all of the data units of the plurality of data units based on the initial age value of all the plurality of data units matching or exceeding the cycle count 300K and 400K.

Figure 6:
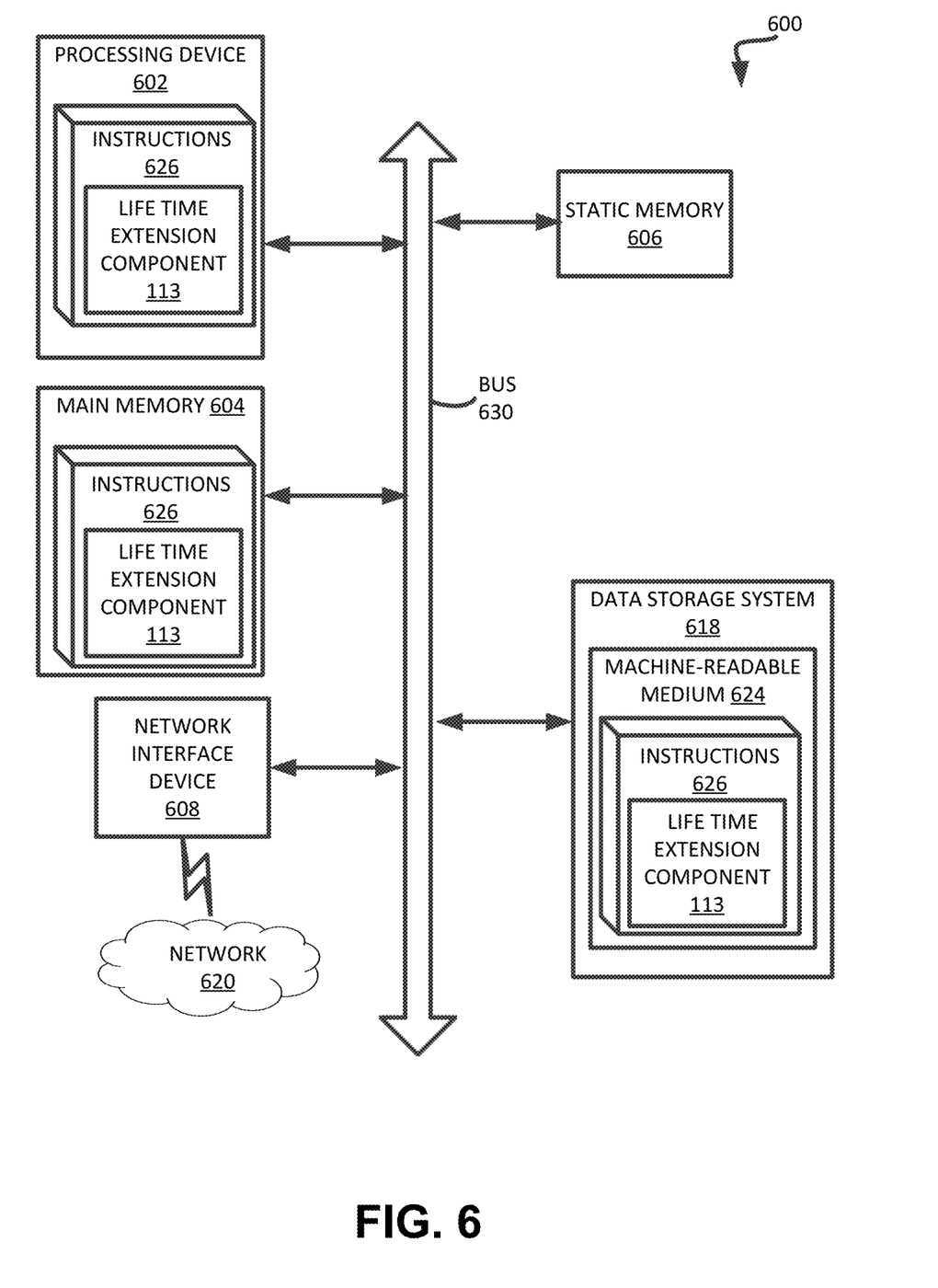
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the life time extension component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a life extension component (e.g., the life time extension component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
obtaining respective life expectancies of a first data unit and a second data unit of the memory device;
determining a longest life expectancy between the first data unit and the second data unit;
calculating, based on a difference between the longest life expectancy and the respective life expectancies of the first data unit and the second data unit, a first initial age value corresponding to the first data unit and a second initial age value corresponding to the second data unit, wherein the first initial age value and second initial age value represent cycle counts at which point a media management operation is to be performed;
identifying a lower one of the first initial age value and the second initial age value;
performing, at a first time, a first media management operation on one of the first data unit or the second data unit associated with the lower one of the first initial age value and the second initial age value; and
performing, at a second time, a second media management operation on the first data unit and the second data unit.

2. The system of claim 1, wherein obtaining the respective life expectancies of the first data unit and the second data unit comprises performing seasoning operations on the memory device.

3. The system of claim 1, wherein the respective life expectancies represent a number of cycle counts that can be performed on the respective data units before failure.

4. The system of claim 1, wherein the first media management operation and the second media operation comprise wear leveling operations.

5. The system of claim 1, wherein the first time is a cycle count of the memory device that matches one of the first initial age value or the second initial age value and the second time is a cycle count of the memory device that matches an other of the first initial age value or the second initial age value.

6. The system of claim 1, wherein the memory device compromises a cross-point array of non-volatile memory cells.

7. A method comprising:
obtaining respective life expectancies of a first data unit and a second data unit of a memory device;
determining a longest life expectancy between the first data unit and the second data unit;
calculating, based on a difference between the longest life expectancy and the respective life expectancies of the first data unit and the second data unit, a first initial age value corresponding to the first data unit and a second initial age value corresponding to the second data unit, wherein the first initial age value and second initial age value represent cycle counts at which point a media management operation is to be performed;
identifying a lower one of the first initial age value and the second initial age value;
performing, at a first time, a first media management operation on one of the first data unit or the second data unit associated with the lower one of the first initial age value and the second initial age value; and
performing, at a second time, a second media management operation on the first data unit and the second data unit.

8. The method of claim 7, wherein obtaining the respective life expectancies of the first data unit and the second data unit comprises performing seasoning operations on the memory device.

9. The method of claim 7, wherein the respective life expectancies represent a number of cycle counts that can be performed on the respective data units before failure.

10. The method of claim 7, wherein the first media management operation and the second media operation comprise wear leveling operations.

11. The method of claim 7, wherein the first time is a cycle count of the memory device that matches one of the first initial age value or the second initial age value and the second time is a cycle count of the memory device that matches an other of the first initial age value or the second initial age value.

12. The method of claim 7, wherein the memory device compromises a cross-point array of non-volatile memory cells.

13. A non-transitory computer-readable storage medium comprising instructions that, when executed by a processing device, cause the processing device to perform operations comprising: obtaining respective life expectancies of a plurality of data units of a memory device; determining a longest life expectancy between the plurality of data units; calculating, based on a difference between the longest life expectancy and the respective life expectancies of the plurality of data units, respective initial age values corresponding to each of the plurality of data units, wherein an initial age value represents a cycle count at which point a media management operation is to be performed on a corresponding data unit; and performing, based on the initial age value, a media management operation on a subset of the plurality of data units associated with initial age values that match a current cycle count of the memory device.

14. The non-transitory computer-readable storage medium of claim 13, wherein obtaining the life expectancy for each of the plurality of data units comprises performing seasoning operations on the memory device.

15. The non-transitory computer-readable storage medium of claim 13, wherein the respective life expectancies represent a number of cycle counts that can be performed on a data unit before failure.

* * * * *